United States Patent [19]
Babb et al.

[11] Patent Number: 5,633,882
[45] Date of Patent: May 27, 1997

[54] ERROR DETECTION AND CORRECTION CIRCUIT

[75] Inventors: Brendan J. Babb, Anchorage, Ak.; Steven B. Sidman, Vancouver, Wash.

[73] Assignee: Advanced Micro Devices, Inc., Sunnyvale, Calif.

[21] Appl. No.: 615,033

[22] Filed: Mar. 11, 1996

Related U.S. Application Data

[63] Continuation of Ser. No. 740,109, Aug. 5, 1991, abandoned.
[51] Int. Cl.⁶ .......................... G06F 11/00; H03M 13/00
[52] U.S. Cl. .......................... 371/40.1; 371/49.2
[58] Field of Search .................. 371/40.1, 40.2, 371/40.4, 37.4, 37.8, 48, 49.2, 37.1

[56] References Cited

U.S. PATENT DOCUMENTS

| | | | |
|---|---|---|---|
| 4,271,519 | 6/1981 | Hall | 371/40.1 |
| 4,277,844 | 7/1981 | Hancock et al. | 371/38 |
| 4,334,309 | 6/1982 | Bannon et al. | 371/38 |
| 4,412,329 | 10/1983 | Yarborough, Jr. | 371/47 |
| 4,612,640 | 9/1986 | Mehrotra et al. | 371/51 |
| 4,646,312 | 2/1987 | Gold'sbury et al. | 371/40.1 |
| 4,730,320 | 3/1988 | Hidaka et al. | 371/38 |
| 4,737,830 | 6/1988 | Kawashima et al. | 371/40.1 |
| 4,817,095 | 3/1989 | Smelser et al. | 371/38 |
| 4,858,236 | 8/1989 | Ogasawara | 371/40.1 |
| 4,993,028 | 2/1991 | Hillis | 371/39.1 |
| 5,014,273 | 5/1991 | Gagliardo et al. | 371/37.7 |
| 5,056,095 | 10/1991 | Horiguchi et al. | 371/40.1 |

*Primary Examiner*—Hoa T. Nguyen
*Attorney, Agent, or Firm*—Benman, Collins & Sawyer

[57] ABSTRACT

The present invention addresses the need in the art by providing a novel approach to the correction of errors in check bits in an encoded data word. The invention consists of a check bit output latch 16 which stores check bits generated by a check bit generator 14 and outputs the newly generated check bits to memory 12 when a single error occurs in the word located in the check bits. The data is corrected so the newly generated check bits are correct and can be latched out to memory 12 at the same time the data is latched out. The invention includes a syndrome generator 18, an error corrector 34, and an error detector 36. The present invention provides a powerful performance boost to error detection and correction circuits by correcting check bits in memory with newly generated check bits when no errors in the data word are detected.

3 Claims, 2 Drawing Sheets

ERROR DETECTION AND CORRECTION CIRCUIT

This is a Continuation of Application Ser. No. 07/740,109, filed Aug. 5, 1991, now abandoned

BACKGROUND OF THE INVENTION

1. Field of the Invention

The present invention relates to error detection and correction codes. More specifically, the present invention relates to techniques for correcting check bit errors.

While the present invention is described herein with reference to illustrative embodiments for particular applications, it should be understood that the invention is not limited thereto. Those having ordinary skill in the art and access to the teachings provided herein will recognize additional modifications, applications, and embodiments within the scope thereof and additional fields in which the present invention would be of significant utility.

2. Description of the Related Art

A typical memory chip is a square array of data-storage cells. The 64K chip, for example, consists of an array of 256 by 256 data-storage cells. Each cell stores one bit, a 0 or a 1. The 0's and 1's stored in a memory chip are represented by the presence or absence of negative electric charge at sites in the silicon crystal. Each site has an electrical property which makes it a potential well or electronic trap for negative charge. When a 0 is to be stored in a given cell, the potential well at the site is filled with electrons. When a 1 is to be stored, the well is emptied of electrons. When the cell is read, its negative charge is measured. If the charge exceeds a certain value, the stored bit is declared to be a 0, otherwise it is declared to be a 1.

Errors can occur when a cell loses its charge, or if an uncharged potential well acquires a charge. Hard errors occur when a given cell is stuck at 0 or stuck at 1 or toggling between 0 and 1.

Error correcting codes help correct most errors that occur when data is stored or read from computer memories. Error correcting codes, such as the Hamming Code, group data bits together with parity bits into a codeword using an encoding algorithm. The parity bits act as checks for the data bits. Errors occurring in the storing or reading of data bits from the computer memory are detected and corrected with a decoding algorithm.

High speed Error Detection and Correction (EDC) chips use a Modified Hamming Code (MHC) to perform single error correction/double error detection (SEC/DED). The MHC technique generates check bits from an input data word which are stored along with the data as a total word in memory. Most MHC chips read the data in from memory and generate new check bits which are compared with the check bits read from memory to generate syndrome bits. The syndrome bits are then ORed to determine if any errors have occurred. If a single error has occurred, the syndromes are sent through a matrix decoder which determines the location of the error. If the error occurs in the data word, the data word is corrected and output. If the error occurs in the check bits, the data is correct and can therefore be output directly, but the check bit error is usually ignored and remains in the memory.

Check bit errors are usually detected by most error detection and correction chips and can be corrected externally. However, additional circuitry is generally required. Correcting check bit errors externally also requires additional processing time which significantly affects the performance of the chip.

Thus, there is a need in the art for an improved system for correcting check bit errors which does not adversely affect the processing speed of the system.

SUMMARY OF THE INVENTION

The present invention addresses the need in the art by providing a novel approach to the correction of errors in check bits in an encoded data word. The invention includes a check bit generator which receives a data word and outputs generated check bits. A syndrome generator receives as inputs the generated check bits and stored check bits and outputs syndrome bits in response thereto. An error detector decodes the syndrome bits to detect an error or a multiple error in the data word or in the stored check bits and outputs two single bits providing an indication of the presence of the error. A check bit output latch selectively outputs the generated check bits on the detection of an error in the stored check bits, thereby correcting check bit errors, and an error corrector outputs a corrected data word. The present invention provides a powerful performance boost to error detection and correction circuits by correcting check bits in memory with newly generated check bits when no errors in the data word are detected.

DESCRIPTION OF THE INVENTION

Illustrative embodiments and exemplary applications will now be described with reference to the accompanying drawings to disclose the advantageous teachings of the present invention.

Modified Hamming codes, given a data word to generate check bits which are stored along with the data word in memory. During a read operation, the modified Hamming code uses the check bits to detect and locate errors. The Modified Hamming Code not only detects errors in the data word but in the check bits as well. Though most MHC implementations can correct check bit errors, few MHC implementations correct check bit errors automatically. In fact, most MHC implementations ignore the check bit errors. The present invention greatly enhances the performance of error detection and correction circuits by correcting check bits in memory with newly generated check bits when no errors in the data word are detected.

During a read cycle a data word is read from memory and new check bits are generated. The check bits from memory are also read in and XORed with the new check bits resulting from memory syndrome bits. The syndrome bits are then decoded to locate any errors in the data word. However if a check bit is in error, conventional error detection and correction systems signal a single bit error and output the data word unchanged. Conventional error detection and correction systems do not correct the check bit error and leave the error in the memory. The present invention makes use of the fact that the correct check bits have already been generated when there are no errors in the data bits.

Figure 1:
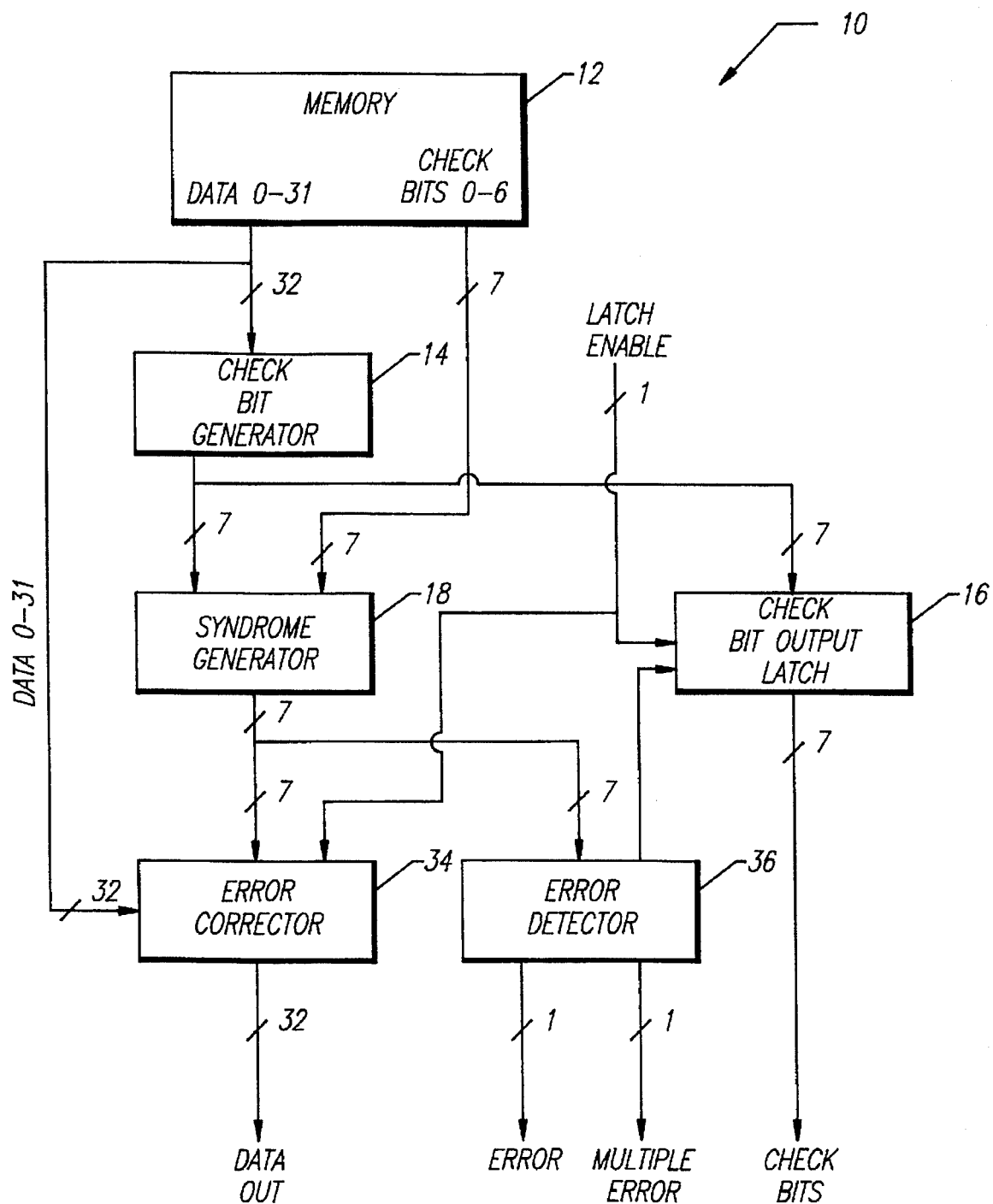
FIG. 1 is a schematic diagram of an illustrative implementation of a 32 bit error detection and correction circuit constructed in accordance with the teachings of the present invention.

FIG. 1 is a schematic diagram of an illustrative implementation of a 32 bit error detection and correction circuit constructed in accordance with the teachings of the present invention. In the preferred embodiment, the 32 bit error detection and correction circuit of the present invention 10 consists of a memory chip 12. The memory chip 12 stores an encoded word which consists of a 32 bit data word and 7 check bits. A conventional check bit generator 14 reads the 32 bit data word from the memory chip 12 and generates 7 check bits according to a modified Hamming Code.

In accordance with the present teachings, a check bit output latch 16 is provided which stores the 7 newly generated check bits. The 7 newly generated check bits are available to be written back to the memory chip 12 when the data is latched out from memory. An external or internal device that determines if a check bit error or data error has occurred can be used to determine if the 7 newly generated check bits should be written back to memory. In the preferred embodiment, the invention is implemented on a single error detection and correction chip.

Figure 2:
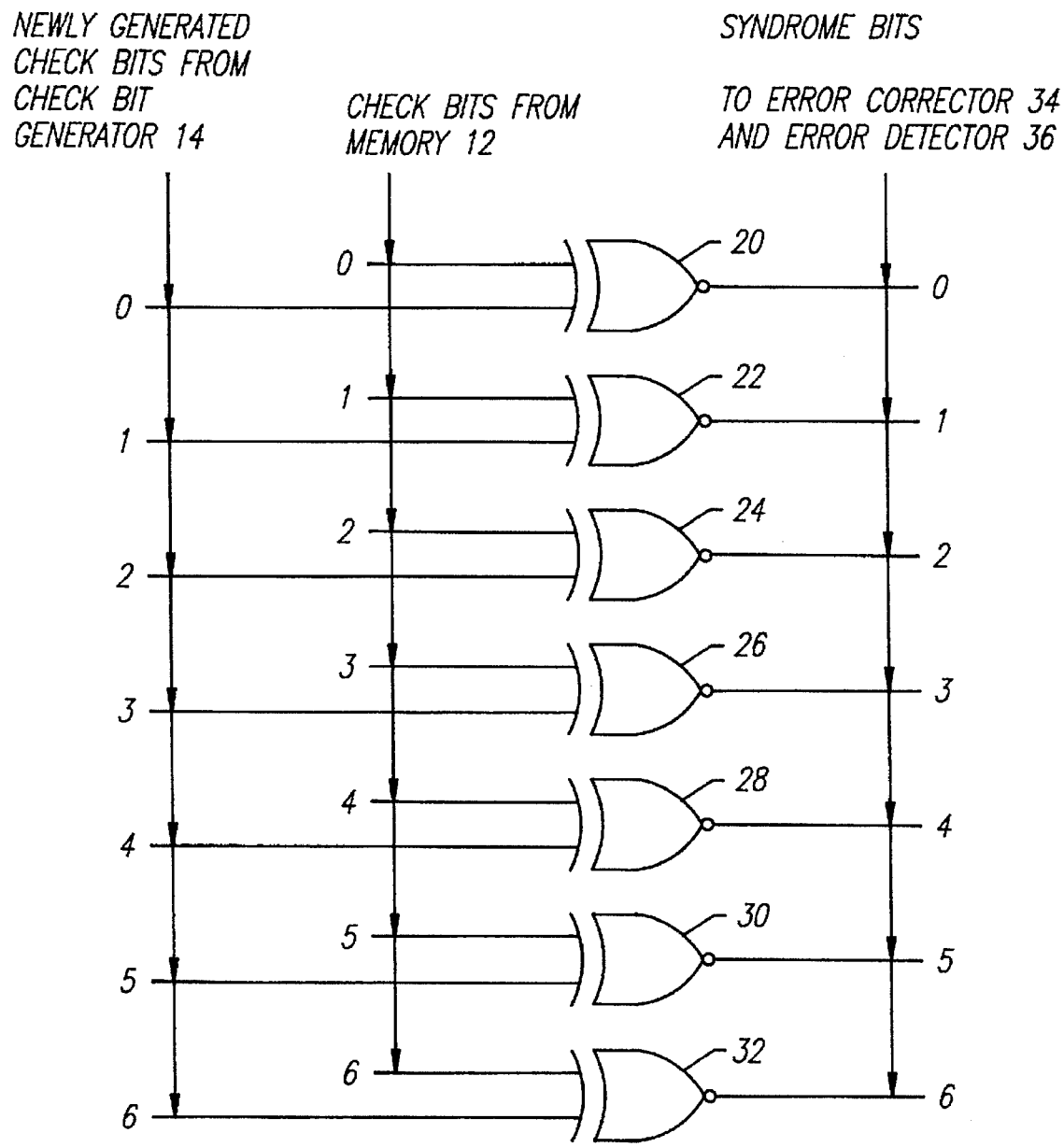
FIG. 2 is a schematic diagram of an illustrative implementation of a 7 bit syndrome generator constructed in accordance with the teachings of the present invention.

A syndrome generator 18 compares the newly generated check bits with the 7 check bits stored in the memory chip 12 and generates 7 syndrome bits. As shown in FIG. 2, the syndrome generator 18 may be implemented with 7 2-bit XOR gates 20 through 32 (even numbers only). Each check bit from the memory 12 is connected to a first input of each XOR gate 20 through 32 and a corresponding check bit generated in the check bit generator 18 is connected to the second input of each XOR gate. The resulting outputs of each of the XOR gates are the syndrome bits.

A conventional error corrector 34 connected to the output of the syndrome generator 18 reads the 32 data bits from memory and outputs the corrected 32 data bits.

A conventional error detector 36 connected to the syndrome generator 18 detects the presence of either a single bit data error, a multiple data bit error, or no data bit errors.

Thus, the present invention has been described herein with reference to a particular embodiment for a particular application. Those having ordinary skill in the art and access to the present teachings will recognize additional modifications applications and embodiments within the scope thereof. For example, the invention is not limited to a specific number of bits in the data word. Nor is it limited to a specific number of check bits. For this reason, the invention is easily adaptable to error detection and correction circuits requiring a different number of check bits. Further, the improved error detection and correction circuit of the present invention can be modified to accommodate error detection and correction circuits using a different number of data bits or check bits without departing from the scope thereof. In addition, the invention is not limited to a particular error detection and correction coding scheme. Many schemes may be utilized without departing from the scope of the present teachings.

The invention is not limited to a particular logic. Functionally equivalent logic may be used wherever applicable. In some cases, reverse logic may be used without departing from the scope of the present invention.

It is therefore intended by the appended claims to cover any and all such applications, modifications and embodiments within the scope of the present invention. Accordingly,

What is claimed is:

1. An improved error detection and correction circuit comprising:

a check bit generator which receives a 32 bit data word and outputs 7 generated check bits in response thereto;

a syndrome generator which receives as inputs said 7 generated check bits from said check bit generator and 7 stored check bits and outputs 7 syndrome bits in response thereto;

an error detector which receives as input said 7 syndrome bits from said syndrome generator, decodes said 7 syndrome bits to detect an error or a multiple error in said 32 bit data word or in said 7 stored check bits, and outputs two single bits providing an indication of the presence of the error;

a check bit output latch which receives as inputs said 7 generated check bits from said check bit generator and selectively outputs said 7 generated check bits on the detection of the error in the 7 stored check bits for correcting stored check bit errors; and an error corrector which receives as inputs said 7 syndrome bits from said syndrome generator and said 32 bit data word and outputs a corrected 32 bit data word.

2. An improved error detection and correction circuit for use with a device for detecting errors in stored check bits and providing an output enable signal on detection of such errors, said correction circuit comprising:

first means for providing a data word and a first set of check bits;

second means for generating a second set of check bits corresponding to said data word;

third means for outputting syndrome bits in response to the generated second set of check bits and the first set of check bits and for detecting an error in the first set of check bits; and fourth means for storing said second set of check bits and selectively outputting said second set of check bits in response to said enable signal on the detection of the error in the first set of check bits, wherein the output of said fourth means is provided to said first means, thereby correcting check bit errors.

3. An improved error detection and correction circuit comprising:

a check bit generator which receives a data word and outputs generated check bits in response thereto;

a syndrome generator which receives as inputs said generated check bits from said check bit generator and stored check bits and outputs syndrome bits in response thereto;

an error detector which receives as input said syndrome bits from said syndrome generator, decodes said syndrome bits to detect an error in said bit data word or in said stored check bits, and outputs an indication of the presence of the error;

a check bit output latch which receives as inputs said generated check bits from said check bit generator and selectively outputs said generated check bits on the detection of the error in the stored check bits for correcting stored check bit errors; and an error corrector which receives as inputs said syndrome bits from said syndrome generator and said data word and outputs a corrected data word.

* * * * *